(12) United States Patent
Shirakawa

(10) Patent No.: US 6,380,018 B1
(45) Date of Patent: Apr. 30, 2002

(54) SEMICONDUCTOR DEVICE AND METHOD FOR THE PRODUCTION THEREOF

(75) Inventor: Iwao Shirakawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/630,137

(22) Filed: Aug. 1, 2000

Related U.S. Application Data

(62) Division of application No. 09/099,534, filed on Jun. 18, 1998, now Pat. No. 6,133,087.

(30) Foreign Application Priority Data

Jun. 20, 1997 (JP) .............................. 9-164492

(51) Int. Cl.⁷ ................ H01L 21/8238; H01L 21/8242; H01L 21/336; H01L 21/76
(52) U.S. Cl. ...................... 438/210; 438/225; 438/227; 438/228; 438/239; 438/241; 438/297; 438/439; 438/444
(58) Field of Search ................ 438/228, 297, 438/239, 210, 225, 227, 241, 439, 425, 426, 253, 250, 243, 444

(56) References Cited

U.S. PATENT DOCUMENTS

| | | | |
|---|---|---|---|
| 4,352,236 A | | 10/1982 | McCollum .................. 438/241 |
| 4,892,614 A | * | 1/1990 | Chapman et al. ........... 438/425 |
| 5,061,654 A | | 10/1991 | Shimizu et al. ............. 438/241 |
| 5,071,777 A | * | 12/1991 | Gahle ........................ 438/443 |
| 5,134,085 A | * | 7/1992 | Gilgen et al. ............... 438/210 |
| 5,350,941 A | | 9/1994 | Madan |
| 5,478,759 A | * | 12/1995 | Mametani et al. .......... 438/228 |
| 5,612,241 A | | 3/1997 | Arima ........................ 438/241 |
| 5,712,205 A | * | 1/1998 | Park et al. .................. 438/425 |
| 5,972,778 A | * | 10/1999 | Hamada ..................... 438/444 |
| 6,004,862 A | * | 12/1999 | Kim et al. .................. 438/425 |
| 6,133,115 A | * | 10/2000 | Fukase ....................... 438/430 |
| 6,225,186 B1 | * | 5/2001 | Su et al. ..................... 438/400 |
| 6,239,001 B1 | * | 5/2001 | Takaishi ..................... 438/431 |
| 6,265,286 B1 | * | 7/2001 | Boyer et al. ................ 438/443 |

FOREIGN PATENT DOCUMENTS

| | | |
|---|---|---|
| JP | 59-4046 | 1/1984 |
| JP | 63-79371 | 4/1988 |
| JP | 63-239861 | 10/1988 |
| JP | 3-262154 | 11/1991 |
| JP | 4-343247 | 11/1992 |

OTHER PUBLICATIONS

Japanese Office Action dated Oct. 10, 2000, with partial translation.

* cited by examiner

*Primary Examiner*—Carl Whitehead, Jr.
*Assistant Examiner*—Toniae M. Thomas
(74) *Attorney, Agent, or Firm*—McGinn & Gibb, PLLC

(57) ABSTRACT

A semiconductor device having two or more types of separation oxide film are formed on the substrate of the semiconductor device by different methods so as to correspond with element types formed on the same semiconductor substrate. The method for producing the semiconductor device comprises a first separation oxide film formation process, and a second separation oxide film formation process. In the first separation oxide film formation process, a first mask layer is formed on the semiconductor substrate, the first mask layer of the element separation region of the logic element is selectively removed and the semiconductor substrate in the region area selectively oxidized. In second separation oxide film formation process, the remaining first mask layer is removed, a second mask layer is formed, the second mask layer of the element separation region of DRAM elements is then selectively removed, and the semiconductor substrate of the region is selectively oxidized.

16 Claims, 7 Drawing Sheets

FIG. 6
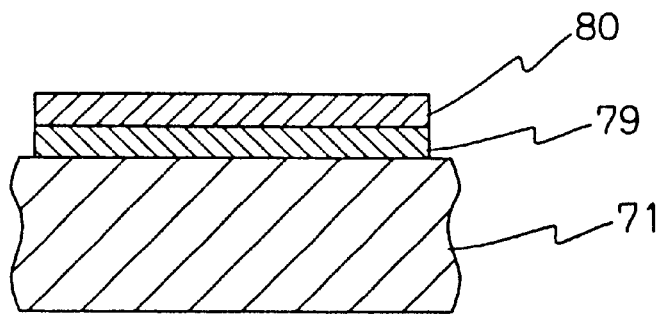
FIG. 6 (a)
PRIOR ART
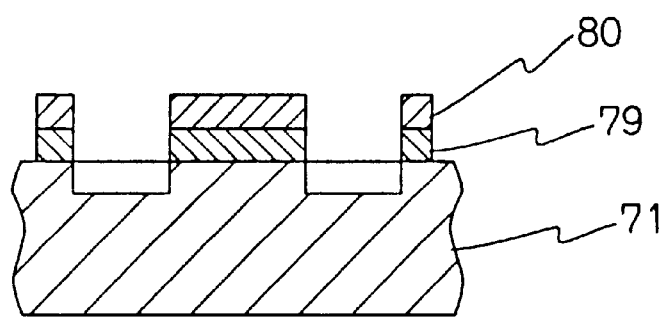
FIG. 6 (b)
PRIOR ART
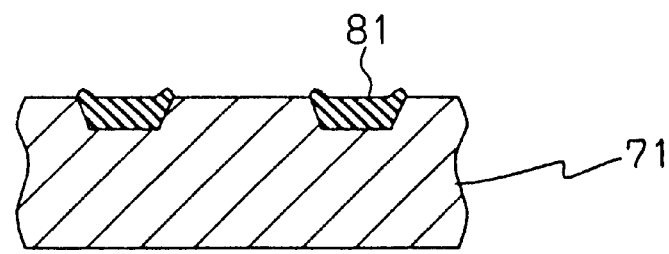
FIG. 6 (c)
PRIOR ART

SEMICONDUCTOR DEVICE AND METHOD FOR THE PRODUCTION THEREOF

This is a Divisional Application of application Ser. No. 09/099,534, filed Jun. 18, 1998, now U.S. Pat. No. 6,133,087.

BACKGROUND OF THE INVENTION

1. Field of the Invention

The present invention relates to a semiconductor device of the CMOS type, and more particularly relates to a semiconductor device of the CMOS type in which a DRAM element and logic element are formed on the same substrate, and method for production thereof.

2. Description of the Related Art

Recently, in seeking to create a more compact and rapid LSI, developments have advanced in dual-mounted DRAM/logic technology in which a DRAM element and logic element are formed on the same substrate. That the DRAM element and logic element are formed on the same substrate has advantages. This is because a large number of wires can be formed between the DRAM element and the logic element within the LSI. In other words, the rate of data transmission can be readily increased, for example graphic processing performance can be improved. For this reason, the field of application is widening into the graphic accelerators for image processing.

In general, there are large differences in the production processes for a semiconductor device for a DRAM and a semiconductor device for logic unit. Even when comparing methods of element separation for example, there are differences between those for DRAM elements and those for logic elements.

Normally, as shown in FIGS. 4 and 5, methods for selective oxidation (referred to as LOCOS 1 and LOCOS 2 herein below) is used in element separation of DRAM elements.

Here, LOCOS is an acronym of "Local Oxidation of Silicon". First, a brief description of LOCOS 1 will be given with reference to FIG. 4.

As shown in FIG. 4(a), a thin oxide film 52 and $Si_3N_4$ film 53 are formed, in that order, on the P-type semiconductor substrate 1.

As shown in FIG. 4(b), the $Si_3N_4$ film 53 and thin oxide film 52 are selectively removed by a widely known technique of photoetching. Then, using the $Si_3N_4$ film 52 as a mask, selective oxidation is performed, and a separation oxide film 54 for the purpose of element separation is formed. Following this, the elements are separated and LOCOS-1 completed by the removal of the $Si_3N_4$ film 53 and thin oxide film 52, as shown in FIG. 4(c).

There are problems in that along with a size-reduction of the DRAM element, when a separation oxide film 54 is formed by LOCOS-1, there are problems in that the interval (pitch) between the element separation region and element formation region cannot be reduced due to the presence of what are known as bird beaks in which the oxide film protrudes in the lateral direction. As a strategy to overcome this problem, and to suppress the spread of oxidation to the element formation region, practitioners have come to use LOCOS-2 in which a polysilicon film is placed below the $Si_3N_4$ film and the birds beak absorbed in this area. A brief description of LOCOS-2 will be given using FIG. 5.

As shown in FIG. 5(a), a thin oxide film 65, polysilicon film 66, and $Si_3N_4$ film 67 are formed, in that order, on a P-type semiconductor substrate 61.

As shown in FIG. 5(b), the $Si_3N_4$ film 67 is selectively removed by the conventional technique of photoetching, and, using the $Si_3N_4$ film 67 as a mask selective oxidation performed, and a separation oxide film 68 is formed. Following this, the separation oxide film is formed as shown in FIG. 5(c), and LOCOS-2 completed by removal of the $Si_3N_4$ film 67, polysilicon film 66, and thin oxide film 65.

Meanwhile, LOCOS-1 and LOCOS-2 have conventionally been used in the element separation of logic elements. Accompanying the change to gate lengths on the half-micron scale, however, has seen the introduction of the use of LOCOS-3. LOCOS-3 is a method in which, following slight preparatory digging of the semiconductor substrate, the area which has been dug is selectively oxidized. The object of LOCOS-3 is to suppress the level-differences which occur as a result of the oxide film. This is because, where there are level-differences occurring in the surface of the substrate in which a separation oxide film has been formed, and where a photoresist acting as a mask has been coated on, the thickness of the photoresist film is not uniform. Where the thickness of the photoresist is non uniform in this way, the thickness of lines of DRAM or other elements formed in the lithography process which follows are not uniform. This is referred to as the standing wave effect. For this reason, LOCOS-3, a method which allows separation oxide films with few level-differences has come into use. A brief description of LOCOS-3 will be given using FIG. 6.

First, as shown in FIG. 6(a), a thin oxide film 79, and $Si_3N_4$ film 80 are formed, in that order, on a P-type semiconductor substrate 71.

As shown in FIG. 6(b), the $Si_3N_4$ film 80, thin oxide film 79, and part of the semiconductor substrate 71 to the required depth, are selectively removed by photoetching. With the $Si_3N_4$ film 80 as a mask, selective oxidation is then performed, and a separation oxide film 81 formed. Following this, element separation is carried out as shown in FIG. 6(c), and LOCOS-3 is completed by removal of the $Si_3N_4$ film 80 and thin oxide film 79.

As described above, in LOCOS-1, LOCOS-2, and LOCOS-3, element separation is performed using the separation oxide films from the selective oxidization. Generally however, the LOCOS methods are accompanied by the formation of large level-differences on the surface of the semiconductor substrate as a result of volume expansion which occurs in the selective oxidization. A major feature of LOCOS-3 lies in that there is a preparatory digging out of the silicon substrate by photo-etching to prevent the occurrence of these large level-differences.

In each instance of the prior art described above, however, the following drawbacks exist. That is to say, LOCOS-1 and LOCOS-2 are appropriate for the element separation of DRAM elements. Where there is element separation of logic elements formed at a level of about the half-micron scale using LOCOS-1 or LOCOS-2, however, problems arise in that it is difficult to control gate length dimensions. This is because the standing wave effect in lithography cannot be controlled.

Moreover, LOCOS-3 is appropriate for the element separation of logic elements. When LOCOS-3 is applied to the element separation of DRAM elements, however, problems arise in that, as a result of the digging out of the semiconductor substrate, defects occur in the semiconductor substrate, and diffusion layer leakage increases. Generally, in order to preserve data the diffusion layer leakage is set lower in LSI for DRAM than in LSI for logic. For this reason, the properties of LSI for DRAM deteriorate using the LOCOS-3 method in which the semiconductor substrate is dug out.

In addition, LSI for DRAM and LSI for logic have hitherto, been designed and produced using different production techniques. These production techniques are already established. Here, there are different separation oxide films formed by different production techniques. More specifically, the shape and spread of bird beak structures differ. For this reason, when a separation oxide film is formed by one of the methods, (either LOCOS-1 or LOCOS-3 for example), an increase or decrease in the area of the element formation region is induced. The significance of this is that an increase or decrease in the level of LSI integration and/or capacity occurs, and that one of the design assets of LSI for DRAM or logic units already established becomes unusable without further modification.

Where LSI with dual-mounted DRAM/logic units are produced, in order to make good use of the respective LSI design assets for DRAM and for logic of the prior art, the design rules for DRAM and for logic elements of the prior art must be used.

Similar technology to the present invention is disclosed in Japanese Laid Open Patent Application No. H3-262154. In this LSI different types of separation oxide film are formed on the same substrate. More specifically, it relates to a method for producing a Bi-CMOS type LSI. In this known example, separation oxide films of different thickness are formed on a bipolar transistor and CMOS transistor. Here, the method for forming the separation oxide films is the same.

SUMMARY OF THE INVENTION

An object of the present invention is to solve the problems which arise when DRAM and logic elements are formed on the same substrate because of the differences in the production processes of each. An additional object is to solve the problems which arise when the valuable design assets of LSI for logic and DRAM are made use of without further modification.

A further object of the present invention is to eliminate the effect that different types of elements have on each other when formed on the same substrate, and provide a CMOS-type semiconductor device in which a DRAM element and logic element are formed on the same substrate, and provide a method for the production thereof.

In order to accomplish the abovementioned object, the semiconductor device according to the present invention is one in which 2 or more types of separation oxide films are formed by different methods on the same substrate corresponding to the element types formed on the same semiconductor substrate.

In addition, the method for producing a semiconductor device in accordance with the present invention is a method for producing a semiconductor device which comprises: a first separation oxide film formation process, and a second separation oxide film formation process. More specifically, in the abovementioned first separation oxide film formation process, following the formation of a first mask layer on the semiconductor substrate, the abovementioned first mask layer of the element separation region of the logic element is selectively removed, and the semiconductor substrate in that area is selectively oxidized. Moreover, in the second separation oxide film formation process, following the removal of the abovementioned remaining first mask a second mask layer is formed, the abovementioned second mask layer of the element separation region of the DRAM element is then removed, and, as above, the semiconductor substrate in that area undergoes selective oxidation.

The present invention allows the optimum separation oxide film required for the element type formed on the substrate to be formed. In other words, the standing wave effect in the logic element formation region is low, and a separation oxide film with low level-differences can be formed. For this reason, the gate length of the element which is formed can be stabilized. Furthermore, in the formation region of the DRAM element, a separation oxide film can be formed by selective oxidation with low diffusion layer leakage, and deterioration of the properties of DRAM can be prevented.

In addition, using the present invention, because the separation oxide films for element separation are formed separately, an increase or decrease in the area for element separation does not occur. For this reason, there is no increase and/or decrease in LSI capacity and level of integration. As a result, even when a dual-mounted type of LSI is produced, the conventional design rules for DRAM and LSI units can be applied without further modification, and good use of the valuable design assets of the prior art can be made.

Furthermore, by the formation of a predetermined diffusion layer between the separation oxide film for logic units and separation oxide film for DRAM, and by covering of the area around the cell-transistor-forming well by the separation oxide film and diffusion layer, the noise-susceptible DRAM element is protected from leakage current of the logic element. For this reason, erroneous operations of the DRAM element can be prevented.

This is a sectional view showing, in process order, a method for producing a semiconductor device according to an embodiment of the present invention.

[FIG. 2]

This is a sectional view showing, in process order, a method for producing another semiconductor device according to an embodiment of the present invention.

[FIG. 3]

This is a sectional view of a semiconductor device according to an embodiment of the present invention.

Figure 4A:
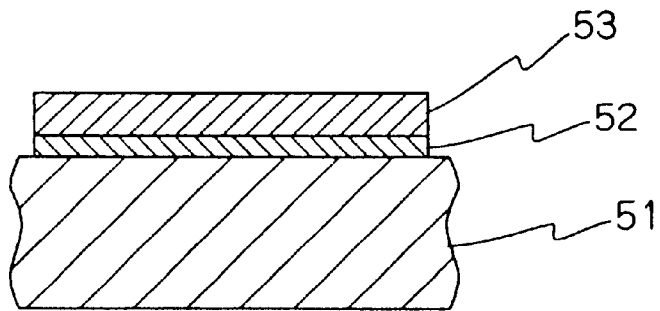
Figure 4B:
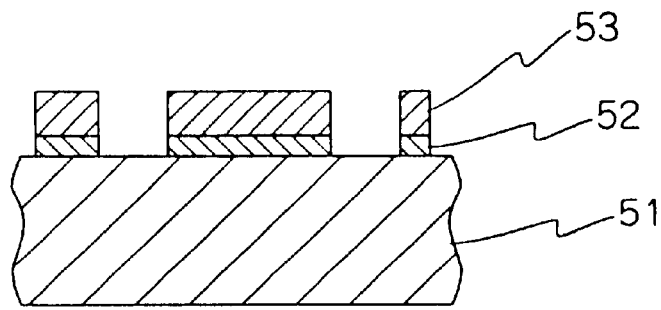
Figure 4C:
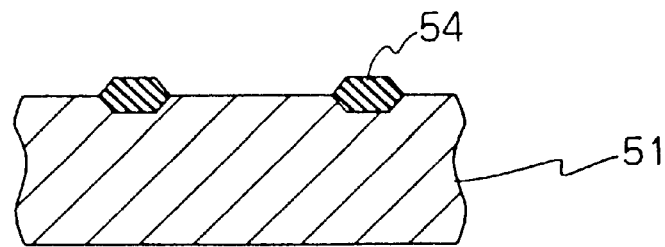

[FIGS. 4(a)–4(c)]

This is a sectional view of an example of prior art.

Figure 5A:
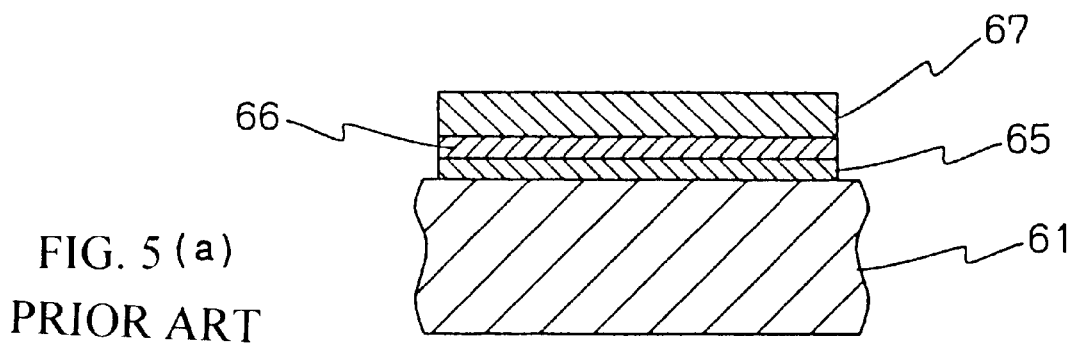
Figure 5B:
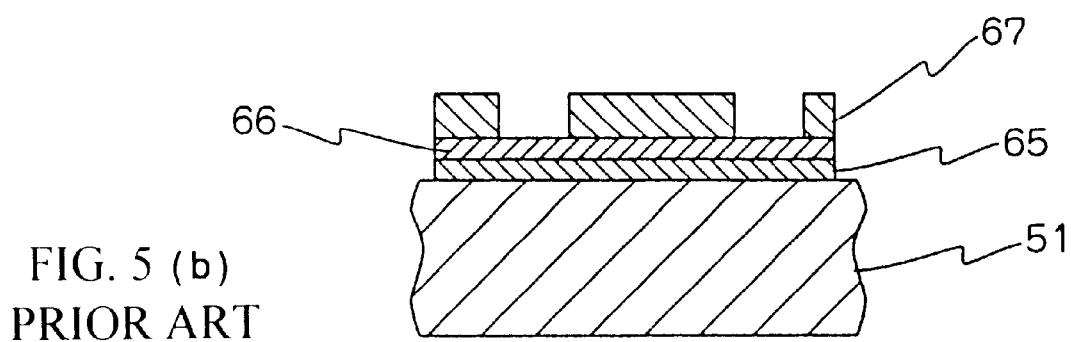
Figure 5C:
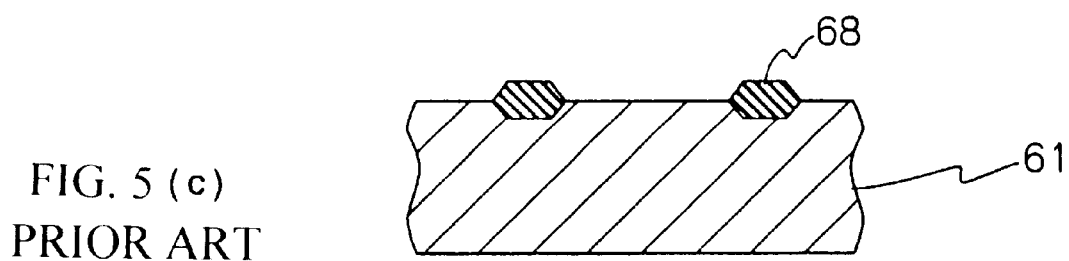

[FIGS. 5(a)–5(c)]

This is a sectional view of an example of prior art.

[FIGS. 6(a)–6(c)]

This is a sectional view of an example of prior art.

[FIG. 7]

This is a flow chart showing a production process for a semiconductor device of the present invention.

DESCRIPTION OF THE PREFERRED EMBODIMENTS

A description of embodiments of the present invention is given below with reference to the diagrams.

Embodiment 1

Figure 3:
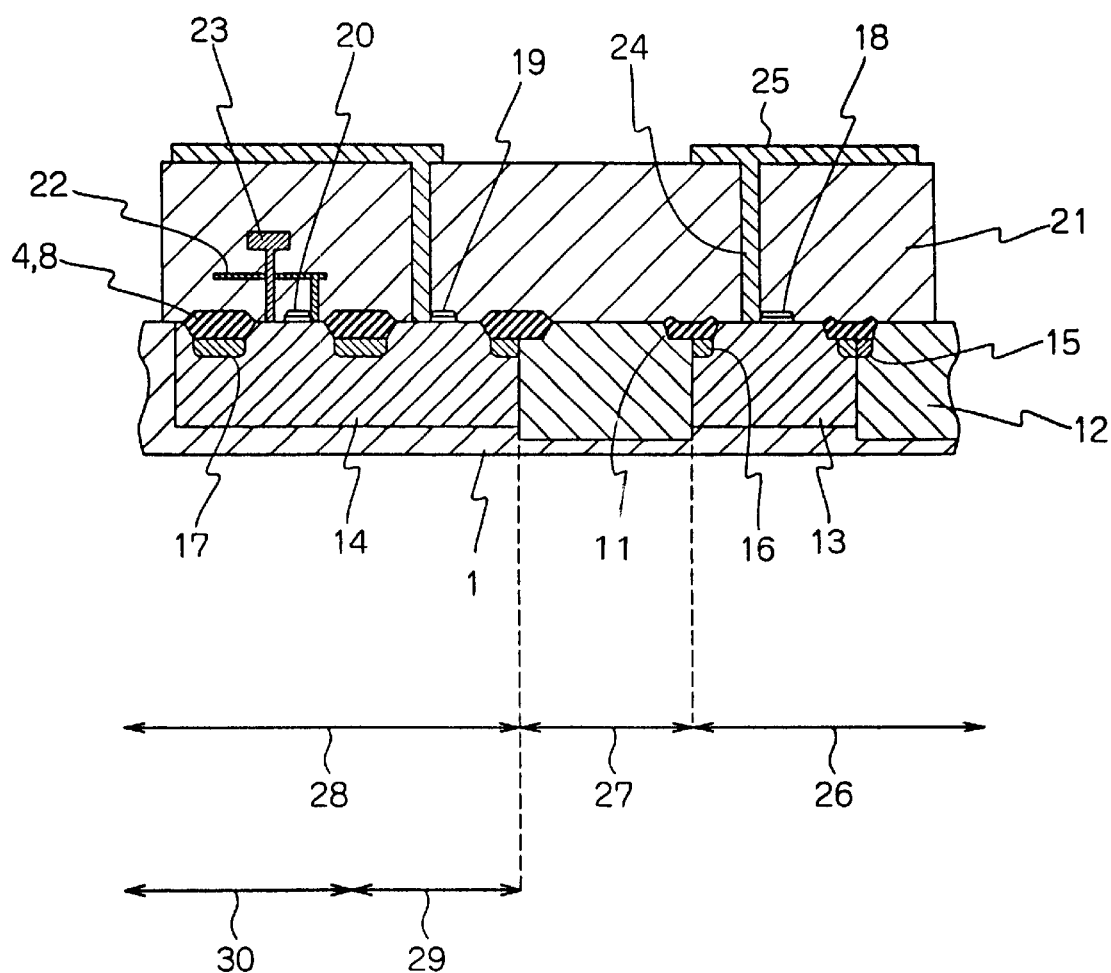

FIG. 3 is a sectional view showing an LSI on which are mounted both a DRAM element and logic element according to the present embodiment.

As shown in FIG. 3, a separation oxide film 11 with low level-differences (less than 500) is formed in the logic element formation region 26 on the surface of the P-type semiconductor substrate (Si substrate) 1 so as to suppress the standing wave effect. Meanwhile, separation oxide films 4 and 8 for DRAM are formed in a DRAM element region 28. Here, the thickness of the separation oxide film 11 for the logic element and a separation oxide film 4 or 8 for the DRAM element is in the range of 1500 Å to 3000 Å.

In order to electrically isolate the logic element formation region 26 and DRAM element region 28 a diffusion layer not belonging to either the logic element or the DRAM element is formed as a buffer region 27 between the separation oxide film 11 and separation oxide films 4 or 8.

After the separation oxide film 11 and separation oxide films 4 or 8 have been formed, a P-well 14 and N-well of the DRAM element, and a P-well 12 and N-well 13 of the logic element are formed.

In the same way, after the separation oxide film 11 and separation oxide films 4 or 8 have been formed, channel stop layers 15, 16 and 17 are formed in one or both of the MOS of the PMOS or NMOS of the DRAM and logic elements. The reference 29 indicates a peripheral circuit, 30 indicates the cell unit.

Following this, gates 19 and 20 of the DRAM element, and gate 18 of the logic element are formed. An inter-layer film 21 is then formed, and bit lines 22 and 23 of the memory cell unit are formed. The required circuit is then formed using a contact 24, and aluminum wires 25.

Embodiment 2

A detailed description of a method for producing a semiconductor in accordance with a second embodiment of the present invention is given below with reference to the diagrams.

Figure 1A:
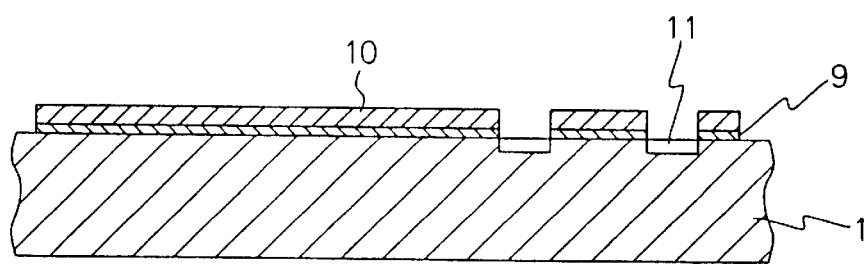
[FIG. 1]

In a method for production a semiconductor device in accordance with the first embodiment, firstly, as shown in FIG. 1(a), a thin oxide film 9 of approximately 300 Å, and a nitride film of approximately 2000 Å are grown on a P-type semiconductor substrate 1. Afterwards, as shown in the same figure, the nitride film 10 and thin oxide film 9 of the element separation region of the logic element are selectively removed by the known photoetching method. Subsequently, the semiconductor substrate 1 is dug to a depth of approximately 800 Å. Next, using the nitride film as a mask, a separation oxide film 11 of approximately 3000 Å is formed by selectively oxidizing the semiconductor substrate 1 of the element separation region of the logic element, at a temperature of around 1000° C.

Figure 1B:
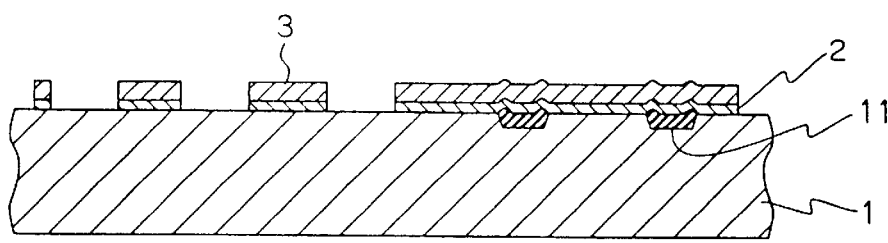
Figure 1C:
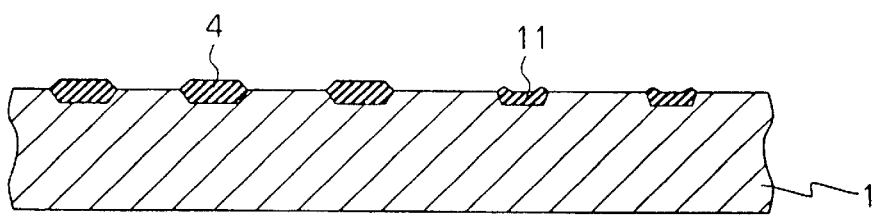

Next, the nitride film 10 and thin oxide film 9 remaining on the semiconductor substrate are removed, after which, as shown in FIG. 1(b), a thin oxide film 2 of approximately 100 Å, and nitride film 3 of approximately 1500 Å are created on the P-type semiconductor substrate 1. Following this, as shown in the same figure, the nitride film 3 and thin oxide film 2 of the element separation region of the DRAM element are selectively removed. Subsequently, using the nitride film 3 as a mask, a separation oxide film 4 where the separation oxide film is approximately 2000 Å is formed by selective oxidizing of the semiconductor substrate 1 of the element separation region of the DRAM element, at a temperature of around 1000° C. Finally, when the nitride film 3 and thin oxide film 2 remaining on the semiconductor substrate 1 are removed, then, as shown in FIG. 1(c), two kinds of element separation oxide films 4 and 11 can be formed on the P-type semiconductor substrate 1.

It will be noted that, in the embodiment shown in FIG. 1, an example is given in which, following the formation of the separation oxide film 11 of the logic element, the separation oxide film 4 of the DRAM element is formed. However, this is the same as if, following the formation of separation oxide film 4 of the DRAM element, the separation oxide film 11 of the logic element were then formed. Furthermore, separation oxide films may be formed by three or more different types of method.

Figure 1D:
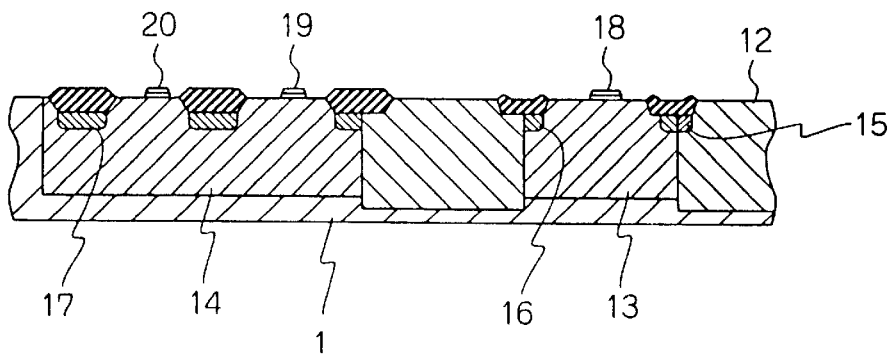

Following formation of the separation oxide film 11 and separation oxide film 4, a well formation and channel stopper of the DRAM and logic elements are formed. As a result, as shown in FIG. 1(d), a MOS transistor can be formed by separation of the DRAM element formation region and logic element formation region.

Finally, although not depicted, following the formation of the memory cell construction, the CMOS-type LSI in which the DRAM and logic elements have been formed on the same semiconductor substrate is completed by carrying out metal wiring.

Embodiment 3

Next, a description of a method for the production of a semiconductor device in accordance with a third embodiment of the present invention is given below with reference to the diagrams 2(a) to (d).

Figure 2:
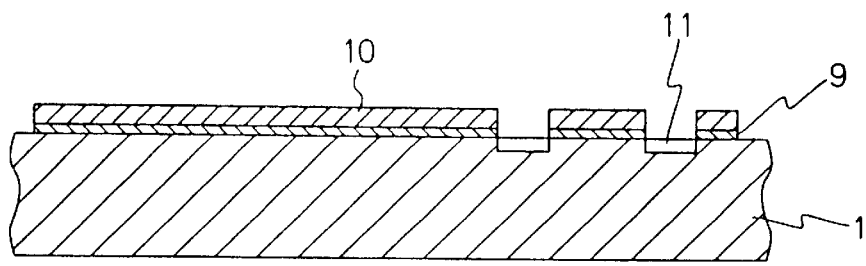
Figure 2:
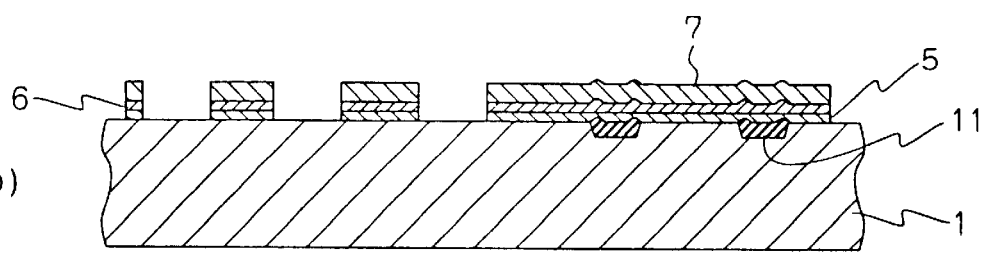
Figure 2:
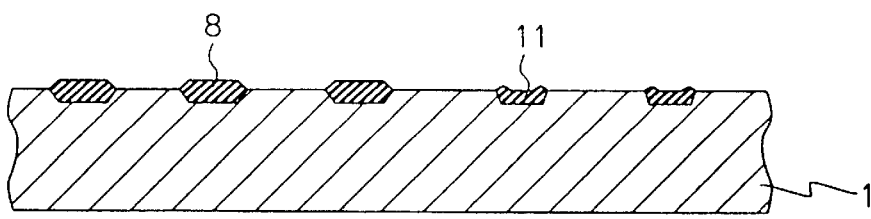
Figure 2:
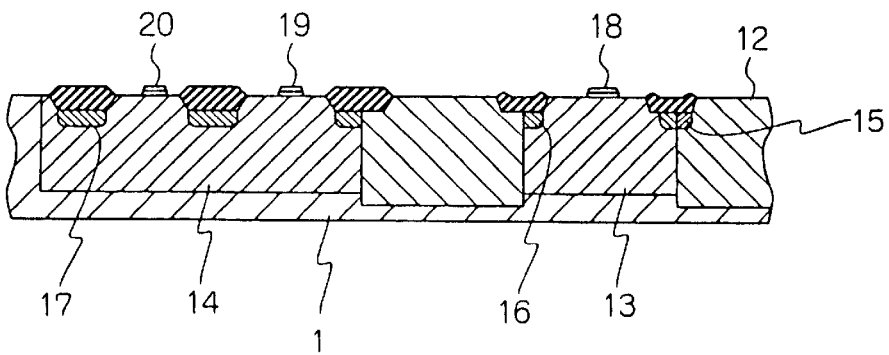

In a method for the production of a semiconductor device in accordance with the present embodiment, firstly, as shown in FIG. 2(a), a thin oxide film 9 of approximately 300 Å, and a nitride film 10 of approximately 2000 Å are grown on a P-type semiconductor substrate 1, following which, as shown in the same diagram, the nitride film 10 and thin oxide film 9 of the element separation region of the logic element are selectively removed by photoetching which is known. Next, the semiconductor substrate 1 is dug to a depth of approximately 800 Å. Then, using the nitride film 10 a mask, a separation oxide film 11 of approximately 3000 Å is formed by selectively oxidizing the semiconductor substrate 1 of the element separation region of the logic element, at a temperature of around 1000° C.

Next, the nitride film 10 and thin oxide film 9 remaining on the semiconductor substrate 1 are removed, after which, as shown in FIG. 2(b), a thin oxide film 5 of approximately 200 Å, polysilicon film 6 of approximately 500 Å, 10 and nitride film 7 of approximately 1800 Å, are grown on the P-type semiconductor substrate 1. Following this, as shown in the same figure, the nitride film 10 of the element separation region of the DRAM element is selectively removed by photoetching. Next, using the nitride film 10 as a mask, a separation oxide film 8 of approximately 2000 Å is formed by selectively oxidizing the polysilicon film 5 and the semiconductor substrate 1 of the element separation region of the DRAM element, at a temperature of around 1000° C. When, as shown in FIG. 2(c), the nitride film 10, polysilicon film 9, and thin oxide film 5 remaining on the semiconductor substrate 1 are removed, a structure with oxide films 8 and 11 for separating 2 types of element can be obtained on the P-type semiconductor substrate 1.

It will be noted that, in the present embodiment, an example is given in which, following the formation of the separation oxide film 11 of the logic element, the separation oxide film 8 of the DRAM element is formed, but this is the same as if following the formation of separation oxide film 8 of the DRAM elements the separation oxide film 11 of the logic element were formed.

Following the formation of separation oxide film 11 and separation oxide film 8, a MOS transistor can be formed in the DRAM element region and logic element formation region as shown in FIG. 1(d), by carrying out well formation and the formation of a channel stopper layer of the DRAM and logic elements. Next, although not depicted, following the formation of the memory cell structure, the CMOS type LSI in which a DRAM element and logic element are formed on the same semiconductor substrate is completed by carrying out metal wiring.

Figure 7:
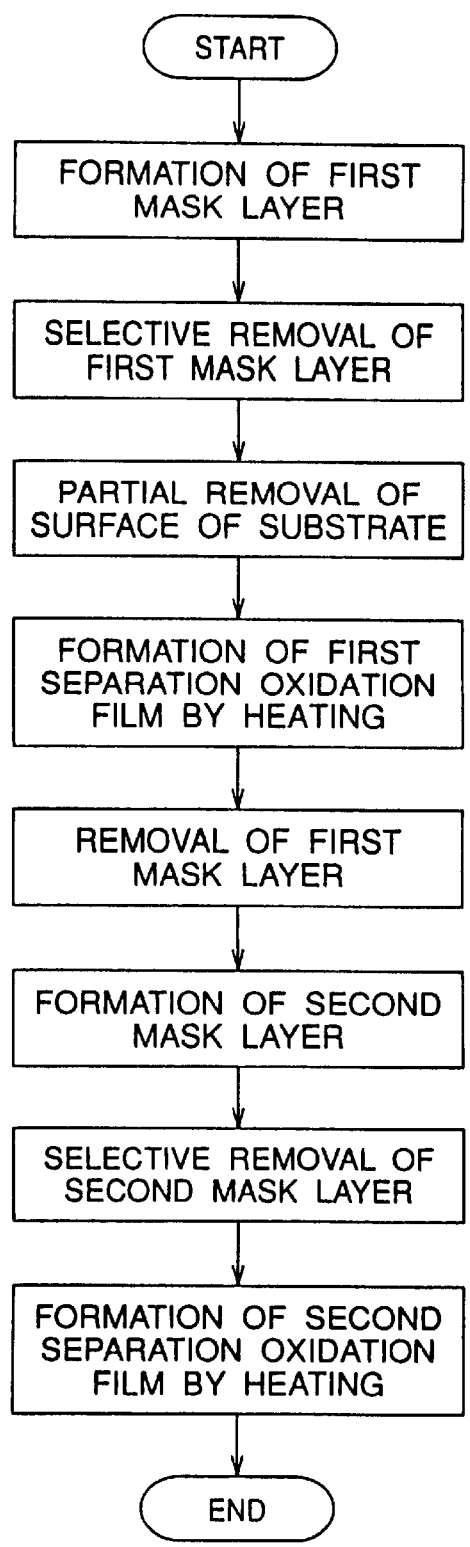

FIG. 7 is a flow chart showing the production process of a semiconductor device of the present invention.

Using the present invention as described above, the optimum separation oxide film required for the element type can be formed. In other words, in the logic element unit, the gate length can be stabilized, and a low-steps separation oxide film with little standing wave effect can be formed. Moreover, in the DRAM element unit, a separation oxide film can be formed by a selective oxidation method with little diffusion layer leakage, and deterioration of the properties of DRAM can be prevented. The reason for this is that the respective separation oxide films of the logic and DRAM elements are formed by separate processes.

Furthermore, even after the dual-mounting, the design rules of the DRAM and logic elements before dual mounting can be used without further modification, and good use can be made of the valuable design assets of .LSI in which the DRAM and logic elements are dual-mounted. The reason for this is because the separation oxide films for the logic and DRAM elements are formed separately, thus avoiding inducing an increase or decrease in the area of an element separation region, and not increasing or decreasing the LSI capacity and/or level of integration.

Furthermore, by using the present invention, current leakage from the logic element can be reduced, and erroneous operation of the noise-susceptible DRAM element can be prevented. The reason for this is because a diffusion layer is formed between the separation oxide film of the logic element and separation oxide film of the DRAM element, and the area around the cell-transistor-forming well is covered by a separation oxide film and diffusion layer, and therefore complete element separation can be achieved.

The invention may be embodied in other specific forms without departing from the spirit or essential characteristic thereof. The present embodiments is therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 9-164492 (Filed on Jun. 20, 1997) including specification, claims, drawings and summary are incorporated herein by reference in its entirety.

What is claimed is:

1. A semiconductor device comprising:

a logic element region comprising a first separation oxide film formed in a hollow portion of a silicon substrate; and a DRAM element region comprising a second separation oxide film formed in a non-hollow portion of said silicon substrate.

2. The semiconductor device according to claim 1, further comprising:

a buffer region formed between said logic element region and said DRAM element region.

3. The semiconductor device according to claim 2, wherein said buffer region comprises a diffusion layer.

4. The semiconductor device according to claim 1, wherein said hollow portion of said silicon substrate is formed by digging out a portion of said silicon substrate.

5. The semiconductor device according to claim 1, wherein said semiconductor device is used in a graphic accelerator for image processing.

6. The semiconductor device according to claim 1, wherein said hollow portion is formed by photo-etching.

7. The semiconductor device according to claim 1, wherein a surface of said semiconductor substrate and said first separation oxide film are substantially coplanar.

8. The semiconductor device according to claim 1, wherein in said logic element region a standing wave effect is substantially suppressed.

9. The semiconductor device according to claim 1, wherein in said DRAM element region a diffusion layer leakage is substantially suppressed.

10. The semiconductor device according to claim 3, wherein said diffusion layer protects a DRAM element from leakage current of a logic element.

11. The semiconductor device according to claim 1, wherein a thickness of said first separation oxide film and a thickness of said second separation oxide film are in a range between about 1500 Å and 3000 Å.

12. The semiconductor device according to claim 1, wherein said hollow portion of said substrate has a depth of about 800 Å.

13. The semiconductor device according to claim 1, wherein said first separation oxide film has a thickness of about 3000 Å and said second separation oxide film has a thickness of about 2000 Å.

14. The semiconductor device according to claim 2, wherein said buffer region electrically isolates said logic element region and said DRAM element region.

15. The semiconductor device according to claim 1, wherein said first and second separation oxide films are formed by local oxidation of silicon.

16. The semiconductor device according to claim 3, further comprising a cell-transistor-forming well formed in at least one of said logic element region and said DRAM element region.

* * * * *